(12) United States Patent
Kang

(10) Patent No.: US 7,741,892 B2
(45) Date of Patent: Jun. 22, 2010

(54) DATA OUTPUT CONTROLLER

(75) Inventor: Tae Jin Kang, Suwon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 31 days.

(21) Appl. No.: 12/215,456

(22) Filed: Jun. 27, 2008

(65) Prior Publication Data

US 2009/0115478 A1    May 7, 2009

(30) Foreign Application Priority Data

Nov. 2, 2007    (KR) ...................... 10-2007-0111517

(51) Int. Cl.
*G11C 1/18* (2006.01)
(52) U.S. Cl. .................. 327/161; 327/284; 327/299; 365/189.15; 365/194; 365/233.1; 365/233.17; 365/233.5
(58) Field of Classification Search ................. 327/153, 327/161, 284, 299; 365/189.011, 189.14–189.16, 365/193, 194, 230.06, 233.1, 233.16–233.19, 365/233.5
See application file for complete search history.

(56) References Cited

U.S. PATENT DOCUMENTS

| | | | | |
|---|---|---|---|---|
| 6,809,990 | B2 * | 10/2004 | Thomann et al. | 365/233.1 |
| 7,146,517 | B2 | 12/2006 | Smetana | |
| 7,212,465 | B2 * | 5/2007 | Kang | 365/193 |
| 7,279,935 | B2 | 10/2007 | Hamdan et al. | |

FOREIGN PATENT DOCUMENTS

KR    10-2005-0099773 A    10/2005

\* cited by examiner

*Primary Examiner*—Lincoln Donovan
*Assistant Examiner*—Patrick O'Neill
(74) *Attorney, Agent, or Firm*—John P. White; Cooper & Dunham LLP

(57) ABSTRACT

Disclosed is a data output controller that includes an enable signal controller, which generates a control signal having a predetermined pulse width in response to a DQ off signal and a write signal and generates a clock enable signal in response to a read signal and the control signal in synchronization with the control signal when the read signal is activated, and a clock generator that receives the enable signal and an internal clock signal and generates a data clock signal in synchronization with the internal clock signal during an activation period of the enable signal.

21 Claims, 5 Drawing Sheets

DATA OUTPUT CONTROLLER

TECHNICAL FIELD

The present disclosure relates to a semiconductor memory device, and more particularly, to a data output controller.

BACKGROUND

In general, a semiconductor memory device includes a plurality of memory cells for storing data and requires a data output controller that outputs data to an external chip cell by reading the data stored in the memory cell.

FIG. 1 is a circuit view of a conventional data output controller.

As shown in FIG. 1, when a read signal (readS) is activated, the conventional data output controller outputs a clock enable signal clkenb having a predetermined activation period in synchronization with a signal Node B output from a delay terminal. Such an enable signal is used for generating a data clock.

In the conventional data output controller, it is important to ensure a margin between the read signal and the signal Node B having a predetermined pulse width. If the read signal has a sufficient pulse width, the data output controller can be normally operated.

However, if the read signal has a narrow pulse width, as shown in FIG. 2, there is no period where both signal Node B and read signal are high levels, so that the clock enable signal clkenb may not be maintained at a low level. As a result, if the read signal has a narrow pulse width, data clocks rclk and fclk are not generated, so that a DRAM may not normally output data.

BRIEF SUMMARY

In an aspect of the present disclosure, a data output controller capable of normally outputting clock signals for outputting data even if a pulse width of an internal clock is changed is provided.

In an embodiment, a data output controller includes an enable signal controller, which generates a control signal having a predetermined pulse width in response to a DQ off signal and a write signal and generates a clock enable signal in response to a read signal and the control signal in synchronization with the control signal when the read signal is activated, and a clock generator that receives the enable signal and an internal clock signal and generates a data clock signal in synchronization with the internal clock signal during an activation period of the enable signal.

The enable signal controller can include a control signal generator, which generates the control signal having the predetermined pulse width when the read signal is activated such that the read signal is synchronized with the control signal.

In another embodiment, a data output controller includes a control signal generator, which receives a DQ off signal, a bank active signal and a write signal, generates a pulse signal in synchronization with the write signal and the DQ off signal and outputs a control signal by delaying a falling edge of the pulse signal by a predetermined interval when an external read command is applied, an enable signal generator, which receives the control signal and a read signal and outputs an enable signal in synchronization with the control signal when the read signal is activated, and a clock generator, which receives the enable signal and an internal clock signal, and generates a data clock signal in synchronization with the internal clock signal during an activation period of the enable signal.

As described above, the data output controller can normally output clock signals even if a pulse width of an internal clock is changed, so that data can be stably output.

BRIEF DESCRIPTION OF THE DRAWINGS

The above and other aspects, features and advantages of the subject matter of the present disclosure will be more clearly understood from the following detailed description taken in conjunction with the accompanying drawings, in which.

DETAILED DESCRIPTION OF PREFERRED EMBODIMENTS

Hereinafter, the present invention will be described in detail through embodiments. The embodiments are just for exemplifying the present invention, and the scope of the present disclosure is not limited by them.

Figure 1:
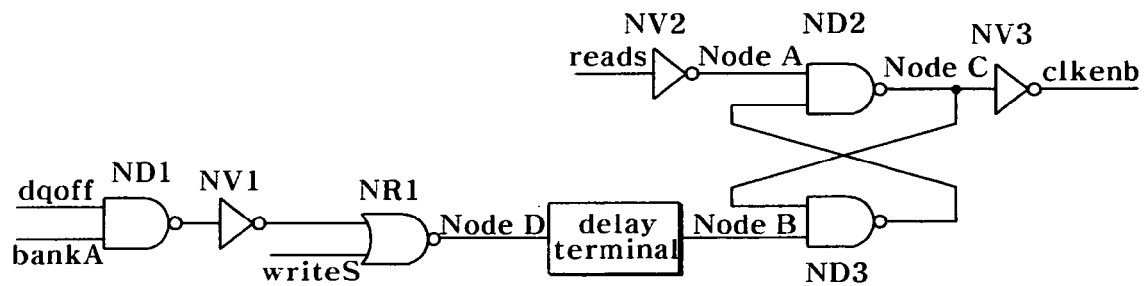
FIG. 1 is a circuit view of a conventional data output controller.
Figure 2:
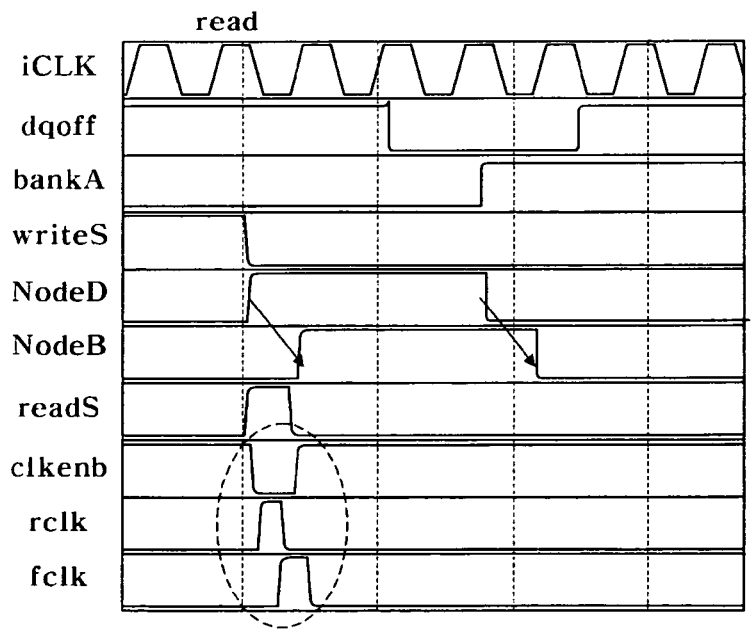
FIG. 2 is a view illustrating signal waveforms of the conventional data output controller shown in FIG. 1.
Figure 3:
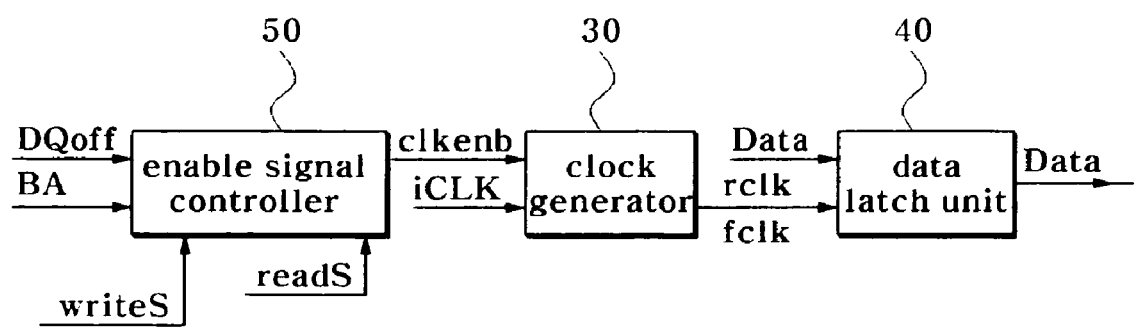
FIG. 3 is a block view illustrating a structure of a data output controller according to an embodiment of the present invention.

FIG. 3 is a block view illustrating a structure of a data output controller according to an embodiment of the present invention.

As shown in FIG. 3, the data output controller includes an enable signal controller 50, which generates a control signal having a predetermined pulse width in response to a DQ off signal and a write signal and generates a clock enable signal in response to a read signal and the control signal in synchronization with the control signal when the read signal is activated, and a clock generator 30 that receives the enable signal clkenb and an internal clock signal iCLK and generates data clock signals rclk and fclk in synchronization with the internal clock signal during an activation period of the enable signal, and a data latch unit 40 for outputting data signals DATA which are input in synchronization with the data clock signals.

Figure 4A:
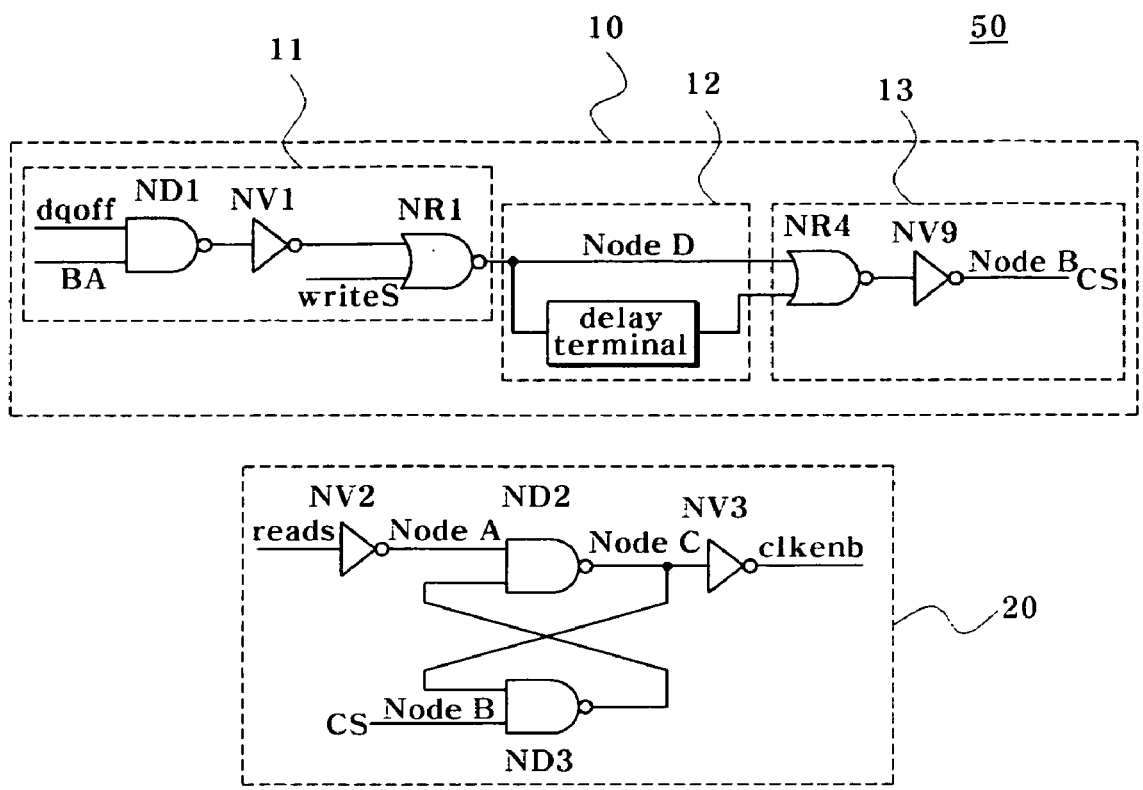
FIGS. 4A and 4B are circuit views illustrating an enable signal controller shown in FIG. 3.

FIG. 4A is a circuit view illustrating the enable signal controller 50 shown in FIG. 3.

As shown in FIG. 4A, the enable signal controller 50 includes a control signal generator 10, which generates the control signal CS having the predetermined pulse width when the read signal is activated such that the read signal is synchronized with the control signal CS.

The control signal generator 10 includes a first operation unit 11 that performs a logical operation in response to a DQ off signal, a bank active signal and a write signal, a delay unit 12 that delays an output signal of the first operation unit 11, and a second operation unit 13 that performs a logical operation with respect to an output signal of the first operation unit 11 and outputs a delayed signal from the delay unit 12.

The DQ off signal is a low-level signal having a pulse width corresponding to a burst length when the read command is applied.

The first operation unit 11 includes a first logic element, including NAND gate ND1, and inverter NV1 that performs AND operation in response to the DQ off signal and the bank active signal, and a second logic element NR2 that performs NOR operation in response to the output signal of the first logic element (ND1 and NV1) and the write signal writes.

The second operation unit 13 includes a third logic element, including NOR gate NR4 and inverter NV9, that performs OR operation with respect to output signals of the first operation unit 11 and the delay unit 12.

In addition, as shown in FIG. 4A, the enable signal controller 50 includes an enable signal generator 20, which receives the control signal CS and the read signal readS and outputs the enable signal clkenb in synchronization with the control signal when the read signal is activated.

The enable signal generator 20 includes a first inverter NV2 that=inverse-converts the read signal, a latch unit, including NAND gates ND2 and ND3, for latching the control signal in response to an output signal of the first inverter NV2 and the control signal CS, and a second inverter NV3 for inverse-converting an output signal of the latch unit.

Figure 4B:
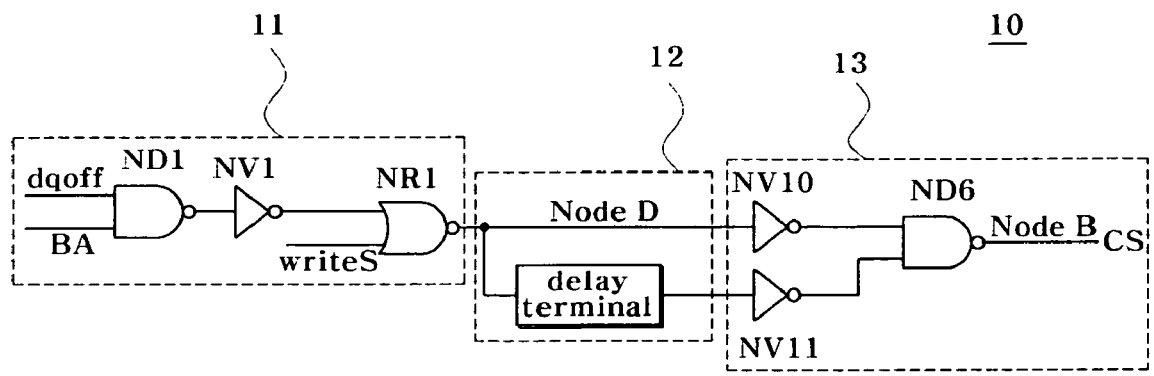

FIG. 4B is a circuit view illustrating a control signal generator 10 according to another exemplary embodiment.

As shown in FIG. 4B, the control signal generator 10 includes a first operation unit 11 that performs a logical operation in response to a DQ off signal, a bank active signal and a write signal, a delay unit 12 that delays an output signal of the first operation unit 11, and a second operation unit 13 that performs a logical operation with respect to an inverse signal of an output signal of the first operation unit 11 and an inverse signal of a delayed signal of the delay unit 12.

The circuit structures of the first operation unit 11 and the delay unit is identical to the circuit structures shown in FIG. 4A. The second operation unit 13 includes a first inverter NV10 that inverse-converts the output signal of first operation unit 11, a second inverter NV11 that inverse-converts the output signal of the delay unit 12, and a third logic element that performs a NAND operation with respect to output signals of the first and second inverters NV10 and NV11.

Figure 5:
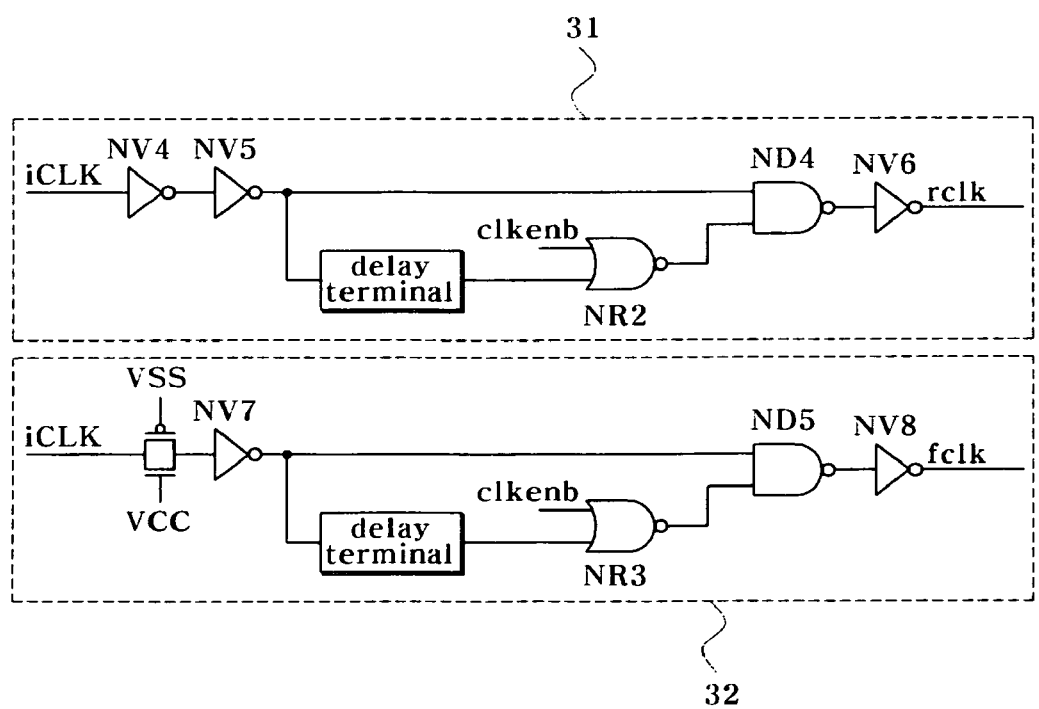
FIG. 5 is a circuit view of a clock generator shown in FIG. 3.

FIG. 5 is a circuit view of the clock generator shown in FIG. 3.

As shown in FIG. 5, the clock generator 30 includes a first clock generator 31, which receives an internal clock signal iCLK and generates a first data clock signal rclk according to the enable signal clkenb, and a second clock generator 32, which receives the internal clock signal iCLK and generates a falling clock signal fclk according to the enable signal clkenb.

That is, the first clock generator 31 receives the enable signal clkenb and the internal clock signal iCLK and generates a first data clock signal rclk in synchronization with the internal clock signal iCLK during an activation period of the enable signal, and the second clock generator 32 receives the enable signal clkenb and the internal clock signal iCLK and generates a second data clock signal fclk in synchronization with an inverse signal of the internal clock signal iCLK during an activation period of the enable signal.

Figure 7:
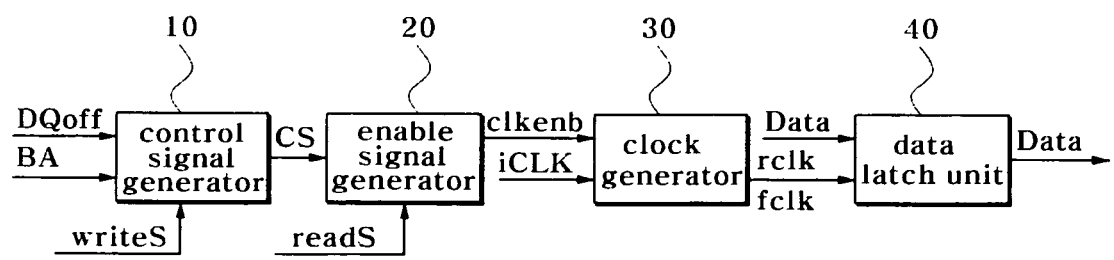
FIG. 7 is a block view illustrating a structure of a data output controller according to another embodiment of the present invention.

FIG. 7 is a block view illustrating a structure of a data output controller according to another exemplary embodiment of the present invention.

As shown in FIG. 7, the data output controller includes a control signal generator 10, which receives a DQ off signal DQ off, a bank active signal BA and a write signal writes, generates a pulse signal in synchronization with the write signal and the DQ off signal and outputs a control signal CS by delaying a falling edge of the pulse signal by a predetermined interval when an external read command is applied, an enable signal generator 20, which receives the control signal CS and a read signal readS and outputs an enable signal clkenb in synchronization with the control signal CS when the read signal is activated, and a clock generator 30, which receives the enable signal clkenb and the internal clock signal iCLK and generates a data clock signal rclk and fclk in synchronization with the internal clock signal iCLK during an activation period of the enable signal clkenb.

The circuit structures of the control signal generator 10, the enable signal generator 20 and the clock generator 30 are identical to the circuit structures shown in FIGS. 4A and 5.

Figure 6:
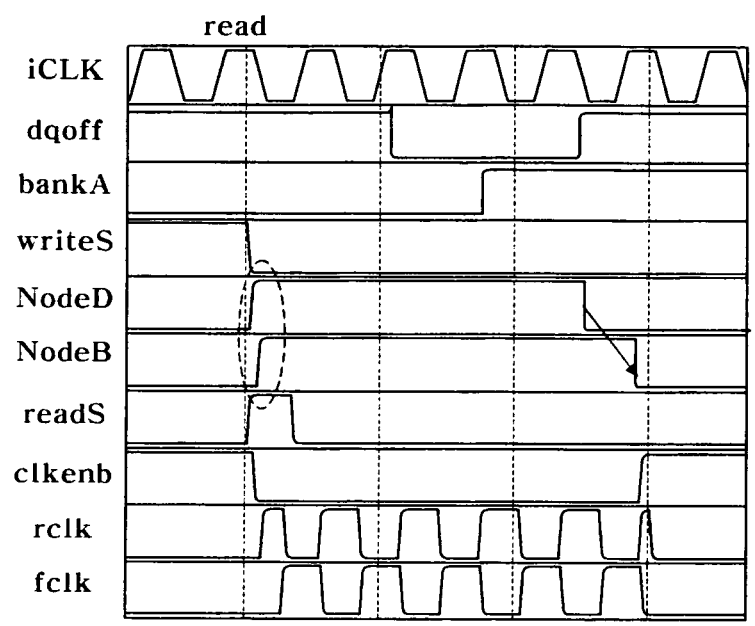
FIG. 6 is a view illustrating signal waveforms of the data output controller.

FIG. 6 is a view illustrating signal waveforms of the data output controller according to the present invention.

As shown in FIG. 6, the control signal generator 10 can generate the control signal having a predetermined pulse width such that the read signal readS can be synchronized with the control signal CS even if the pulse width of the read signal readS is reduced, so that the enable signal generator 20 can generate the enable signal, which is activated during a predetermined period in synchronization with the internal clock signal iCLK, when the read signal is activated.

In addition, the clock generator 30 receives the enable signal clkenb and the internal clock signal iCLK to generate the data clock signal rclk and fclk in synchronization with the internal clock signal iCLK during the activation period of the enable signal, and the data latch unit 40 normally outputs the data signal DATA, which is input in synchronization with the data clock signal.

In the examples and exemplary embodiments of the present invention described above, the data clock for outputting data can be normally generated even if the pulse width of the read signal readS is changed, so that the DRAM can stably output the data.

Although preferred embodiments of the present invention have been disclosed for illustrative purposes, those skilled in the art will appreciate that various modifications, additions and substitutions are possible, without departing from the scope and spirit of the invention as defined in the accompanying claims.

The present disclosure claims priority to Korean application number 10-2007-0111517, filed on Nov. 2, 2007, the entire contents of which are incorporated herein by reference.

What is claimed is:

1. A data output controller comprising:

a control signal generator configured to generate a control signal having a predetermined pulse width in response to a DQ off signal and a write signal;

an enable signal generator configured to receive the control signal and a read signal and output a clock enable signal in synchronization with the control signal when the read signal is activated; and a clock generator configured to receive the clock enable signal and an internal clock signal, and generate a data clock signal in synchronization with the internal clock signal during an activation period of the clock enable signal, wherein the control signal generator includes:

a first operation unit configured to perform a logical operation in response to a DQ off signal, a bank active signal and a write signal;

a delay unit configured to output a delayed signal by delaying an output signal of the first operation unit; and a second operation unit configured to perform a logical operation with respect to the output signal of the first operation unit and the delayed signal of the delay unit.

2. The data output controller of claim 1, further comprising a data latch unit for outputting data signals which are input in synchronization with the data clock signals.

3. The data output controller of claim 1, wherein the first operation unit includes:
a first logic element that performs AND operation in response to the DQ off signal and the bank active signal; and
a second logic element that performs NOR operation in response to an output signal of the first logic element and the write signal, wherein, when an external read command is applied, a pulse signal is generated in synchronization with the write signal and the DQ off signal.

4. The data output controller of claim 3, wherein the second operation unit includes a third logic element that performs OR operation with respect to the output signal of the first operation unit and the delayed signal of the delay unit, and a falling edge of a pulse signal output from the first operation unit is delayed by a predetermined interval.

5. The data output controller of claim 4, wherein the DQ off signal has a pulse width of a predetermined logic level corresponding to a burst length when a read command is applied.

6. The data output controller of claim 1, wherein the enable signal generator including:
a first inverter for inverse-converting the read signal;
a latch unit for latching the control signal in response to an output signal of the first inverter and the control signal; and
a second inverter for inverse-converting an output signal of the latch unit, wherein an enable signal is output in synchronization with the control signal when the read signal is activated.

7. The data output controller of claim 1, wherein the clock generator includes:
a first clock generator configured to receive the enable signal and an internal clock signal and generate a first data clock signal in synchronization with the internal clock signal during an activation period of the enable signal; and
a second clock generator configured to receive the enable signal and an internal clock signal and generate a second data clock signal in synchronization with an inverse signal of the internal clock signal during an activation period of the enable signal.

8. A data output controller comprising:
a control signal generator configured to generate a control signal having a predetermined pulse width in response to a DQ off signal and a write signal;
an enable signal generator configured to receive the control signal and a read signal and output a clock enable signal in synchronization with the control signal when the read signal is activated; and
a clock generator configured to receive the clock enable signal and an internal clock signal, and generate a data clock signal in synchronization with the internal clock signal during an activation period of the clock enable signal,
wherein the control signal generator includes:
a first operation unit configured to perform a logical operation in response to a DQ off signal, a bank active signal and a write signal;
a delay unit configured to output a delayed signal by delaying an output signal of the first operation unit; and
a second operation unit configured to perform a logical operation with respect to an inverse signal of the output signal of the first operation unit and an inverse signal of the delayed signal of the delay unit.

9. The data output controller of claim 8, wherein the first operation unit includes:
a first logic element that performs AND operation in response to the DQ off signal and the bank active signal; and
a second logic element that performs NOR operation in response to an output signal of the first logic element and the write signal, wherein a pulse signal is generated in synchronization with the write signal and the DQ signal when an external read command is applied.

10. The data output controller of claim 9, wherein the second operation unit includes:
a first inverter configured to inverse-convert the output signal of the first operation unit;
a second inverter configured to inverse-convert the delayed signal of the delay unit; and
a third logic element configured to perform a NAND operation with respect to output signals of the first and second inverters, wherein a falling edge of a pulse signal output from the first operation unit is delayed by a predetermined interval.

11. A data output controller comprising:
a control signal generator, configured to receive a DQ off signal, a bank active signal and a write signal, generate a pulse signal in synchronization with the write signal and the DQ off signal and, output a control signal by delaying only a falling edge of the pulse signal by a predetermined interval when an external read command is applied;
an enable signal generator configured to receive the control signal and a read signal and output an enable signal in synchronization with the control signal when the read signal is activated; and
a clock generator configured to receive the enable signal and an internal clock signal and generate a data clock signal in synchronization with the internal clock signal during an activation period of the enable signal.

12. The data output controller of claim 11, further comprising a data latch unit for outputting data signals which are input in synchronization with the data clock signals.

13. The data output controller of claim 11, wherein the control signal generator includes:
a first operation unit configured to perform a logical operation in response to the DQ off signal, the bank active signal and the write signal;
a delay unit configured to output a delayed signal by delaying the output signal of the first operation unit; and
a second operation unit configured to perform a logical operation with respect to an output signal of the first operation unit and an output signal of the delay unit.

14. The data output controller of claim 13, wherein the first operation unit includes:
a first logic element that performs AND operation in response to the DQ off signal and the bank active signal; and
a second logic element that performs NOR operation in response to an output signal of the first logic element and the write signal, wherein, when an external read command is applied, a pulse signal is generated in synchronization with the write signal and the DQ off signal.

15. The data output controller of claim 14, wherein the second operation unit includes a third logic element that performs OR operation with respect to output signal of the first operation unit and the delayed signal of the delay unit, and a falling edge of a pulse signal output from the first operation unit is delayed by a predetermined interval.

16. The data output controller of claim 15, wherein the DQ off signal has a pulse width of a predetermined logic level corresponding to a burst length when a read command is applied.

17. The data output controller of claim 11, wherein the control signal generator includes:
    a first operation unit configured to perform a logical operation in response to the DQ off signal, the bank active signal and the write signal;
    a delay unit configured to output a delayed signal by delaying the output signal of the first operation unit; and
    a second operation unit configured to perform a logical operation with respect to an inverse signal of an output signal of the first operation unit and an inverse signal of the delayed signal of the delay unit.

18. The data output controller of claim 17, wherein the first operation unit includes:
    a first logic element that performs AND operation in response to the DQ off signal and the bank active signal; and
    a second logic element that performs NOR operation in response to an output signal of the first logic element and the write signal, wherein a pulse signal is generated in synchronization with the write signal and the DQ signal when an external read command is applied.

19. The data output controller of claim 18, wherein the second operation unit includes:
    a first inverter configured to inverse-convert the output signal of first operation unit;
    a second inverter configured to inverse-convert the output signal of the delay unit; and
    a third logic element configured to perform a NAND operation with respect to output signals of the first and second inverters, wherein a falling edge of a pulse signal output from the first operation unit is delayed by a predetermined interval.

20. The data output controller of claim 11, wherein the enable signal generator includes:
    a first inverter for inverse-converting the read signal;
    a latch unit for latching the control signal in response to an output signal of the first inverter and the control signal; and
    a second inverter for inverse-converting an output signal of the latch unit, wherein an enable signal is output in synchronization with the control signal when the read signal is activated.

21. The data output controller of claim 11, wherein the clock generator includes:
    a first clock generator configured to receive the enable signal and an internal clock signal and generate a first data clock signal in synchronization with the internal clock signal during an activation period of the enable signal; and
    a second clock generator configured to receive the enable signal and an internal clock signal and generate a second data clock signal in synchronization with an inverse signal of the internal clock signal during an activation period of the enable signal.

* * * * *